US010152389B2

(12) United States Patent
Narasimha et al.

(10) Patent No.: US 10,152,389 B2
(45) Date of Patent: Dec. 11, 2018

(54) APPARATUS AND METHOD FOR INLINE COMPRESSION AND DEDUPLICATION

(71) Applicant: Western Digital Technologies, Inc., Irvine, CA (US)

(72) Inventors: Ashwin Narasimha, Los Altos, CA (US); Ashish Singhai, Los Altos, CA (US); Vijay Karamcheti, Palo Alto, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 14/744,444

(22) Filed: Jun. 19, 2015

(65) Prior Publication Data

US 2016/0371292 A1 Dec. 22, 2016

(51) Int. Cl.
*G06F 15/16* (2006.01)
*G06F 11/14* (2006.01)
(Continued)

(52) U.S. Cl.
CPC .......... *G06F 11/1453* (2013.01); *G06F 11/00* (2013.01); *H03M 7/00* (2013.01); *H03M 7/3091* (2013.01)

(58) Field of Classification Search
CPC ............. G06F 11/1453; G06F 12/0864; G06F 17/3033; H03M 7/30; H04L 49/3009; H04L 69/22; H04N 19/00
See application file for complete search history.

(56) References Cited

U.S. PATENT DOCUMENTS 5,032,987 A * 7/1991 Broder .................. G06F 15/161
707/E17.036
5,406,279 A 4/1995 Anderson et al.
(Continued)

FOREIGN PATENT DOCUMENTS

JP H 06-290020 A 10/1994
JP 2010-061518 A 3/2010
(Continued)

OTHER PUBLICATIONS

"Improving performance and lifetime of solid-state drives using hardware-accelerated compression", Lee, et al. http://ieeexplore.ieee.org/xpl/login.jsp?tp=&arnumber=6131148.
(Continued)

*Primary Examiner* — Hitesh Patel
(74) *Attorney, Agent, or Firm* — Morgan, Lewis & Bockius LLP

(57) ABSTRACT

An apparatus for inline compression and deduplication includes a memory unit and a processor coupled to the memory unit. The processor is configured to receive a subset of data from a data stream and select a reference data block corresponding to the subset of data, in which the reference data block is stored in a memory buffer resident in the memory unit. The processor is also configured to compare a first hash value computed for the subset of data to a second hash value computed for the reference data block, in which the first hash value and the second hash value are stored in separate hash tables and generate a compressed representation of the subset of data by modifying header data corresponding to the subset of data responsive to a detected match between the first hash value and the second hash value in one of the separate hash tables.

8 Claims, 8 Drawing Sheets

(51) Int. Cl.
*G06F 11/00* (2006.01)
*H03M 7/00* (2006.01)
*H03M 7/30* (2006.01)

(56) References Cited

U.S. PATENT DOCUMENTS

| | | |
|---|---|---|
| 6,195,024 B1 | 2/2001 | Fallon |
| 6,278,735 B1 | 8/2001 | Mohsenian |
| 6,374,266 B1 | 4/2002 | Shnelvar |
| 6,724,817 B1 | 4/2004 | Simpson et al. |
| 7,161,506 B2 | 1/2007 | Fallon |
| 7,970,216 B2 | 6/2011 | Bashyam et al. |
| 8,184,663 B2 | 5/2012 | Bates et al. |
| 8,205,065 B2 | 6/2012 | Matze |
| 8,364,929 B2 | 1/2013 | Haines et al. |
| 8,427,346 B2 | 4/2013 | Potkonjak |
| 8,484,427 B1 | 7/2013 | Goldobin et al. |
| 8,542,135 B2 | 9/2013 | Golander et al. |
| 8,593,307 B2 | 11/2013 | Seo et al. |
| 8,725,933 B2 | 5/2014 | Khan |
| 8,751,763 B1 | 6/2014 | Ramarao |
| 8,924,816 B2 | 12/2014 | Khan |
| 9,087,187 B1* | 7/2015 | Doane ............... H04L 9/3226 |
| 9,363,339 B2 | 6/2016 | Bhaskar et al. |
| 2004/0250009 A1 | 12/2004 | Chen et al. |
| 2006/0112264 A1 | 5/2006 | Agarwal |
| 2008/0154928 A1 | 6/2008 | Bashyam et al. |
| 2009/0234870 A1 | 9/2009 | Bates et al. |
| 2010/0125553 A1* | 5/2010 | Huang ............... G06F 11/1453 |
| | | 707/661 |
| 2010/0325094 A1 | 12/2010 | Yang et al. |
| 2011/0022718 A1* | 1/2011 | Evans ............... G06F 3/0608 |
| | | 709/231 |
| 2011/0185149 A1* | 7/2011 | Gruhl ............... G06F 3/0608 |
| | | 711/206 |
| 2011/0264676 A1 | 10/2011 | Belan et al. |
| 2012/0076348 A1* | 3/2012 | Brunk ............... G06K 9/00744 |
| | | 382/100 |
| 2013/0110794 A1 | 5/2013 | Lee |
| 2013/0138620 A1 | 5/2013 | Yakushev et al. |
| 2013/0318051 A1 | 11/2013 | Kumar et al. |
| 2014/0104085 A1 | 4/2014 | Coehn |
| 2014/0189348 A1 | 7/2014 | El-Shimi et al. |
| 2014/0223029 A1* | 8/2014 | Bhaskar ............ H03M 7/3088 |
| | | 709/247 |
| 2014/0244604 A1 | 8/2014 | Oltean et al. |
| 2014/0310476 A1 | 10/2014 | Kruus et al. |
| 2014/0324795 A1 | 10/2014 | Jiang et al. |
| 2014/0351229 A1 | 11/2014 | Gupta |
| 2015/0012507 A1 | 1/2015 | Fallon |
| 2015/0142755 A1 | 5/2015 | Kishi |
| 2017/0097960 A1 | 4/2017 | Narasimha et al. |

FOREIGN PATENT DOCUMENTS

| | | |
|---|---|---|
| JP | 2010-539606 A | 12/2010 |
| JP | 2012-533126 A | 12/2012 |
| JP | 2013-508810 A | 3/2013 |
| KR | 2013-0048595 A | 5/2013 |
| WO | WO-2009/036350 A2 | 3/2009 |
| WO | 2011/092047 | 8/2011 |
| WO | WO-2014/125582 A1 | 8/2014 |

OTHER PUBLICATIONS

"A new compression ratio prediction algorithm for hardware implementations of LZW data compression", Yazdanpanah, et al. http://ieeexplore.ieee.org/xpl/login.jsp?tp=&arnumber=5623592.

Chakrabarti, Amit, et al., "A-Near-Optimal Algorithm for Computing the Entropy of a Stream", SODA '07 Proceedings, ACM-SIAM Symposium on Discrete Algorithms, New Orleans, LA Jan. 7-9, 2007, pp. 328-335.

Anceaume, Emmanuelle, et al., "A Distributed Information Divergence Estimation over Data Streams", IEEE Transactions on Parallel and Distributed Systems, vol. 25, No. 2, Feb. 2014, pp. 478-487.

Ganguly, Sumit, et al., "Hierarchical Sampling from Sketches: Estimating Functions over Data Streams", Algorithmica, vol. 53, Issue, Apr. 2009. pp. 549-582.

Japanese Office Action from Japanese Patent Application No. 2016-121084, dated May 16, 2017.

Australian Examination Report from Australian Patent Application No. 2016203410, dated Oct. 26, 2016.

Japanese Office Action from Japanese Patent Application No. 2016-121095, dispatched Jul. 25, 2017, 8 pages.

Roussev, "Hashing and data Fingerprinting in Digital Forensics," IEEE Security & Privacy, Digital Forensics, Mar./Apr. 2009, pp. 49-55.

Entropy (Information Theory), Wikipedia, downloaded on Sep. 4, 2017 from https://en.wikipedia.org/wili/Entropy_(information_theory), 15 pages.

Korean Office Action from Korean Patent Application No. 10-2016-0074647, dated May 9, 2018, 10 pages.

* cited by examiner

APPARATUS AND METHOD FOR INLINE COMPRESSION AND DEDUPLICATION

CROSS-REFERENCE TO RELATED APPLICATIONS

This application is related to U.S. patent application Ser. No. 14/744,947 titled "APPARATUS AND METHOD FOR SINGLE PASS ENTROPY DETECTION ON DATA TRANSFER," concurrently filed with this application, which is herein incorporated by reference in its entirety.

TECHNICAL FIELD

The present disclosure relates generally to the field of data reduction technology.

BACKGROUND OF INVENTION

High performance, non-volatile storage class memory subsystems are generally composed of relatively expensive components. As such, it is highly desirable to maximize data storage in such systems using data reduction techniques. Data reduction refers to the techniques of data self-compression and data deduplication to reduce the total amount of information that is written to or read from a backend storage system. Data reduction results in the transformation of user (input) data to a more compact representation that can be stored. The advantages of data reduction include improved storage utilization, increased life (in the context of an all-flash storage system), and application acceleration among other advantages.

Data compression refers to process of looking for redundancy within the same data block and then encoding these repeated sequences in such a manner as to reduce the overall size of the data. Data deduplication refers to the process of matching data sequences across multiple blocks in an effort to find matching sequences even if the individual block has uncompressible data. However, conventional systems perform compression and data deduplication as separate steps within the data reduction process. As such, these conventional systems do not combine them into a single step and hence pay latency and bandwidth penalties.

Furthermore, conventional data reduction solutions take a lot of cycles and power in order to perform the compression functions. In any given application data flow, there is always a high probability that a particular set of data blocks may not exhibit self-compression properties. Typically, at the end of a compression stage, conventional solutions perform a check to ensure that the result is not larger than the original block. Accordingly, this is quite late as the resources have already been utilized in trying to compress the data.

SUMMARY OF THE INVENTION

Accordingly, a need exists for a solution that creates a unified data path that performs both data compression and deduplication in a single pass. Embodiments of the present invention combine data compression technologies and extend them by integrating them with data deduplication methods. The single pass nature of embodiments of the present invention allows for the control of system latencies, and helps achieve line rate compression and deduplication at higher speeds (e.g., in a manner that can meet PCIe Gen3 speeds for a given FPGA, or other speed requirements or standards).

Embodiments of the present invention utilize smaller subsets of data, such as 4 kilobyte size data blocks, for compression and can override compression encoding copy formats to differentiate a self-referenced copy from a reference block referenced copy. It should be appreciated that embodiments are not limited to 4 kilobyte size data blocks and that any block size or range of block sizes can be used (e.g., 4 kb, 8 kb, 10 kb, 4 kb-8 kb block size range, etc.). Embodiments can create memory buffer structures that have multiple parallel input buffers to hold reference data blocks. Also, embodiments may include a parallel hash table look up scheme in which searches corresponding to data stored in reference data block buffers can be performed simultaneous to hash lookups performed for data stored in input data buffers.

Additionally, embodiments can use the fill time of reference data buffers to compute and store the shingled hash function values of the reference data for purposes of enhancing data reduction performance. Embodiments can also create an interlock between reference hash table computations and the start of the compression. In this fashion, when compression starts, searches can be performed in either the reference hash table, a compression hash table, or both. Embodiments of the present invention can use heuristics to determine which sequence to use (if any) when a hash hit is detected in one or more of the hash tables. Moreover, embodiments of the present invention can modify back-reference interpretation for either the input data stream or from the input reference buffer.

Furthermore, embodiments of the present invention can detect early on and predict the compressibility of blocks in order to minimize wasted effort and to avoid a loss in overall system performance. Embodiments described herein can analyze compressibility characteristics to make a decision to perform data reduction procedures, such as compression, to a given data block. As such, low impact-high performance entropy detection operations can be performed in a manner that enables a high performance data reduction system to save power and compression unit cycles when given incompressible data.

BRIEF DESCRIPTION OF THE DRAWINGS

The accompanying drawings, which are incorporated in, and form a part of, this specification, and in which like numerals depict like elements, illustrate embodiments of the present disclosure and, together with the description, serve to explain the principles of the disclosure.

DETAILED DESCRIPTION

Figure 1A:
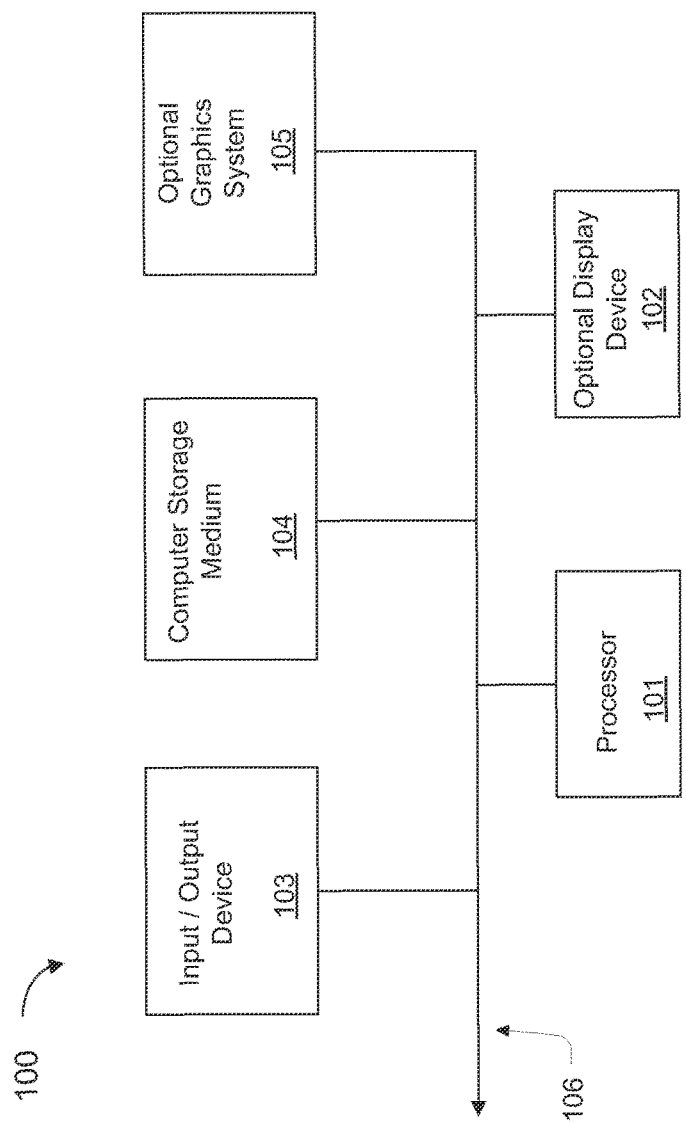
FIG. 1A is a block diagram depicting an exemplary hardware configuration of an inline compression and deduplication system capable of performing dual compression and deduplication procedures in parallel for purposes of data reduction in accordance with embodiments of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. Although a method may be depicted as a sequence of numbered steps for clarity, the numbering does not necessarily dictate the order of the steps.

It should be understood that some of the steps may be skipped, performed in parallel, or performed without the requirement of maintaining a strict order of sequence. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature:

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "receiving" or "selecting" or "generating" or "grouping" or "monitoring" or the like, refer to the action and processes of a computer system, or similar electronic computing device, that manipulates and transforms data represented as physical (e.g., electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Exemplary Inline Compression and Deduplication System Configuration

FIG. 1A is a block diagram depicting an exemplary hardware configuration of an inline compression and deduplication system (e.g., system 100) capable of performing dual compression and deduplication procedures in parallel for purposes of data reduction in accordance with embodiments of the present invention. In this fashion, system 100 can perform data reduction procedures in a single pass such that operations related to data reduction operations, such as data compression and data deduplication, are combined into a single process, a single processing path or in a single step, thereby reducing general system latencies and/or bandwidth penalties. Although specific components are disclosed in FIG. 1A, it should be appreciated that such components are exemplary. That is, embodiments of the present invention are well suited to having various other hardware components or variations of the components recited in FIG. 1A. It is appreciated that the hardware components in FIG. 1A can operate with components other than those presented, and that not all of the hardware components described in FIG. 1A are required to achieve the goals of the present invention. According to some embodiments, components depicted within FIG. 1A can be combined to achieve the goals of the present invention.

System 100 can be implemented as an electronic device capable of communicating with other electronic devices over a data communications bus. For example, bus 106 depicts such a data communications bus. The exemplary system 100 upon which embodiments of the present disclosure may be implemented includes a general purpose computing system environment. In its most basic configuration, system 100 typically includes at least one processing unit 101 and a memory storage unit. For example, computer readable storage medium 104 depicts such a memory storage unit. Depending on the exact configuration and type of device, computer readable storage medium 104 can be volatile (such as RAM), non-volatile (such as ROM, flash memory) or some combination of the two. Portions of computer readable storage medium 104, when executed, facilitate efficient execution of memory operations or requests for groups of threads.

In one embodiment, processor 101 can be a programmable circuit configured to perform the inline compression and deduplication operations described herein. For example, processor 101 can be a FPGA controller or a flash memory device controller. Alternatively, in one embodiment, processor 101 can be operable to execute an inline compression and deduplication program stored in computer readable storage medium 104 and configured to perform functions described herein (see, e.g., FIG. 1B discussed infra). System 100 may also comprise an optional graphics system 105 for presenting information to the computer user, such as by displaying information on an optional display device 102. System 100 also comprises an optional alphanumeric input/output device 103. Input/output device 103 can include an optional cursor control or directing device, and one or more signal communication interfaces, such as a network interface card. Furthermore, interface module 115 includes the functionality to allow system 100 to communicate with other computer systems through an electronic communications network (e.g., the Internet, wired communication networks, wireless communication networks or similar networks).

Additionally, system 100 may also have additional features and functionality. For example, system 100 may also include additional storage media (removable and/or non-removable) including, but not limited to, magnetic or optical disks or tape. Computer storage media includes volatile and nonvolatile, removable and non-removable media implemented in any method or technology for storage of information such as computer readable instructions, data structures, program modules or other data.

Figure 1B:
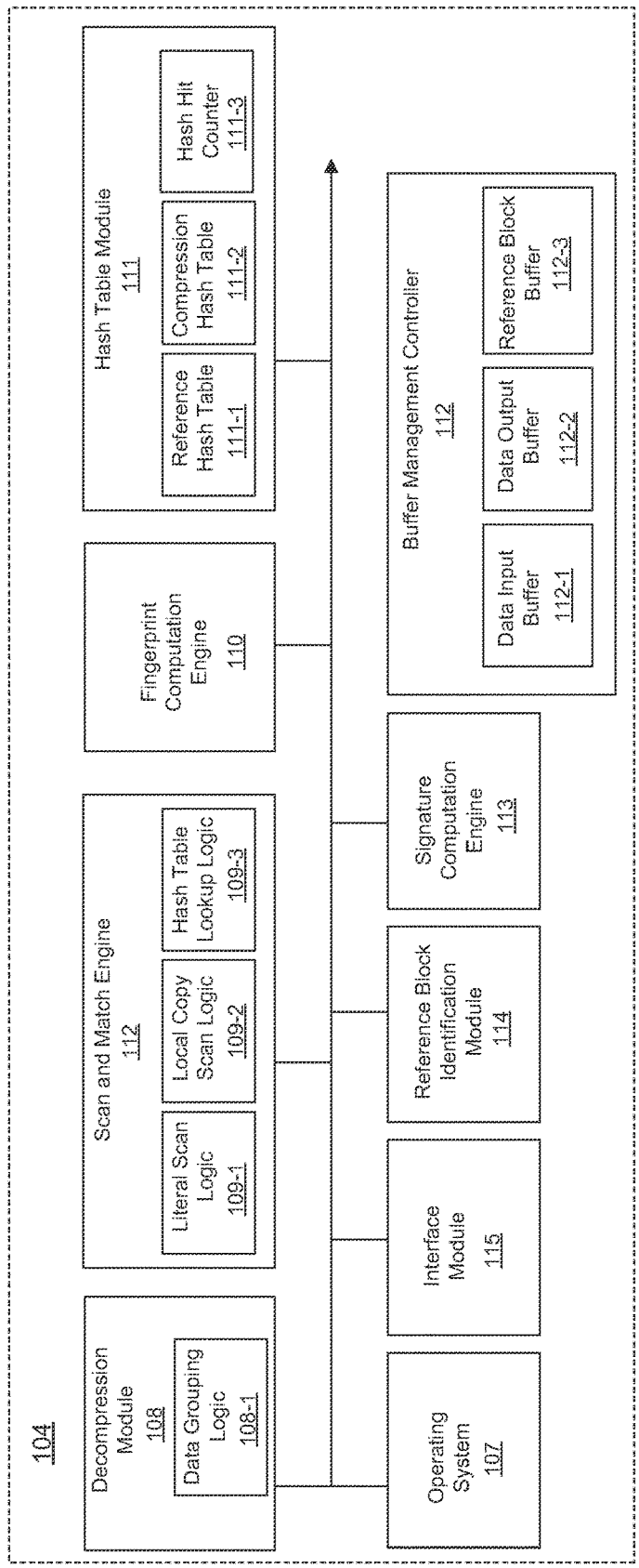
FIG. 1B is a block diagram depicting exemplary components provided in memory for performing inline compression and deduplication procedures in accordance with embodiments of the present invention.

FIG. 1B is a block diagram depicting exemplary components provided in memory for performing inline compression and deduplication procedures in accordance with embodiments of the present invention. Although specific components are disclosed in FIG. 1B, it should be appreciated that such computer storage medium components are exemplary. That is, embodiments of the present invention are well suited to having various other components or variations of the computer storage medium components recited in FIG. 1B. It is appreciated that the components in FIG. 1B can operate with other components than those presented, and that not all of the computer storage medium components described in FIG. 1B are required to achieve the goals of the present invention. According to some embodiments, components depicted within FIG. 1B can be combined to achieve the goals of the present invention. Furthermore, it is appreciated that some hardware components described in FIG. 1A can operate in combination with some components described in FIG. 1B for purposes of achieving the goals of the present invention.

As depicted in FIG. 1B, computer readable storage medium 104 includes an operating system 107. Operating system 107 loads into processor 101 when system 100 is initialized. Also, upon execution by processor 101, operating system 107 can be configured to supply a programmatic interface to system 100. System 100 can also include wireless communication mechanisms. Through such devices, system 100 can be communicatively coupled to other computer systems over a communication network such as the Internet or an intranet, such as a local area network.

Furthermore, as illustrated in FIG. 1B, computer readable storage medium 104 includes fingerprint computation engine 110. Fingerprint computation engine 110 includes the functionality to generate fingerprints using a sequence of bytes for purposes of performing authentication and/or look up procedures. Upon detection of receipt of a data stream, the buffer management controller 112 can communicate signals to the fingerprint computation engine 110 to process data stored in data input buffer 112-1 upon its receipt.

Fingerprints generated by fingerprint computation engine 110 can be used to represent larger files while using a fraction of the storage space otherwise required for storing such larger files. For example, larger files can include pages of content or multimedia files. Fingerprint computation engine 110 can use conventional computer-implemented procedures, such as hash functions to reduce data streams into bits of data for purposes of generating fingerprints so that can be processed by components of system 100, such as signature computation engine 113. Hash computations may be performed in a manner consistent with how other components of system 100 compute hash values, such as hash table module 111 or in a different manner.

In this fashion, fingerprint computation engine 110 can be configured to generate fingerprints for a subset of incoming data associated with a data stream as it is received by system 100. For instance, subsets of data can be in the form of 4 kilobyte increments. In one embodiment, fingerprint computation engine 110 can compute fingerprints for an incoming set of 4 kilobytes associated with a data stream received by system 100 and stored within the data input buffer 112-1 generated by the buffer management controller 112.

The signature computation engine 113 includes the functionality to compute signatures for data streams received by system 100. Signatures can be computed by signature computation engine 113 based on a variety of conventional hash-based signature schemes, including Merkle, Spooky, CRC, MD5, SHA or similar schemes. Signature computation engine 113 can be configured to perform signature computations using sub-block signature computations, Rabin signature-based similarity detection computations, and/or other similarity-based signature computations on data streams received by system 100. According to one embodiment, signature computation engine 113 can use fingerprint data generated by fingerprint computation engine 110 to generate signatures. In one embodiment, upon receipt of a data stream, the buffer management controller 112 can be configured to communicate signals to the signature computation engine 113 to process data stored in data input buffer 112-1 upon its receipt.

The signature computation engine 113 can be configured to compute multiple signatures for subsets of data at time for various portions of an input data stream. In this fashion, signatures computed by the signature computation engine 113 for subsets can be communicated to other components of system 100 for further processing, such as reference block identification module 114. For example, signatures computed by signature computation engine 113 can include mathematical properties that allow them to be similar to or the same as if they are computed on blocks that are similar to or the same as each other. As such, a reference block selected by components of system 100, such as reference block identification module 114, can be based on a corrupted signature that best represents a plurality of similar signature clusters stored in memory resident on system 100. Thus, components of system 100 can perform reference block identification procedures using signatures computed by signature computation engine 113. For example, reference block identification module 114 can use sub-block signatures to perform reference block identification procedures.

Reference block identification module 114 includes the functionality to analyze a plurality of different signature clusters generated by signature computation engine 113 and select reference blocks that can be processed by components of system 100, such as hash table module 111. The reference block identification module 114 can be configured to compare computed signatures to clusters of signatures currently stored by system 100 and correspondingly select a reference block that best represents the computed signature. For example, the reference block identification module 114 can be configured to compare computed signatures to clusters of signatures currently stored in a buffer generated by buffer management controller 112 and correspondingly select a reference block that best represents the computed signature.

Reference blocks selected by the reference block identification module 114 can be stored within buffers generated by buffer management controller 112, such as reference block buffer 112-3, for further processing by components of system 100. Reference blocks can be regular data blocks that have been found to be similar to input data by various methods. For example, reference blocks can be regular data blocks that have been found to be similar to input data by computed using sub-block signatures, similarity detection mechanisms, application hint detection schemes or similar schemes. Reference blocks may also be purely synthetic blocks containing repeated data sequences found to have larger repetition factors. According to one embodiment, reference block identification module 114 can be configured to identify reference blocks using apriori knowledge, content similarity matching, application hints, data pattern recognition, or similar means.

Figure 1C:
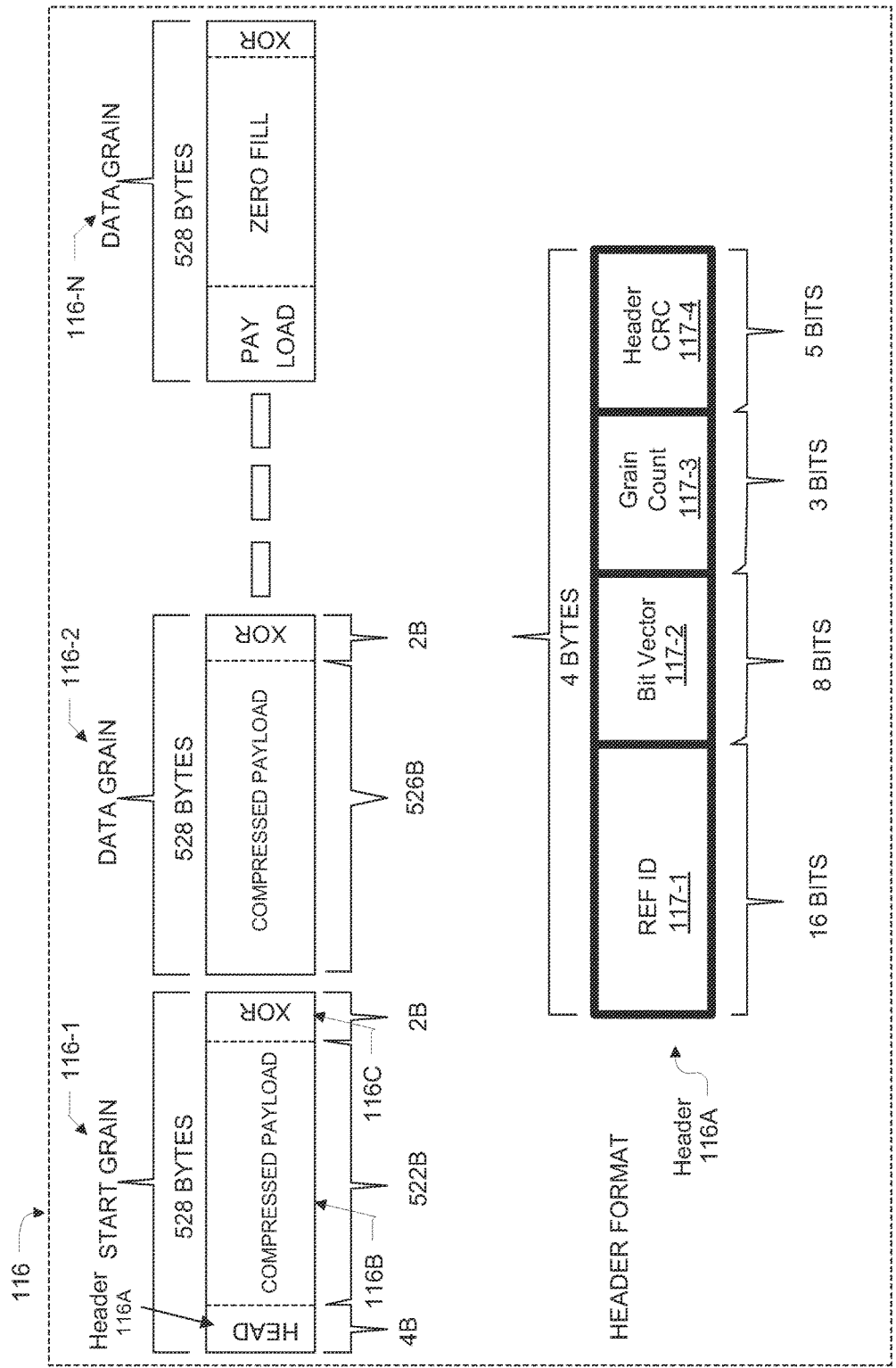
FIG. 1C depicts an exemplary compressed data framing format generated in accordance with embodiments of the present invention.

Furthermore, information concerning reference blocks, such as a reference block stored within reference block buffer 112-3, identified by reference block identification module 114 can be stored within the header portion of a data stream. For instance, with reference to FIG. 1C, the reference block identifier for a reference block identified by reference block identification module 114 can be stored within the header portion 116*a* of data stream 116. As illustrated in FIG. 1C, header data 116*a* can be included within a set of data grains, such as data grains 116*a*, 116-2, and 116-N, along with their respective compressed payload data portions, such as compressed payload 116*b*. In one embodiment, header data 116*a* can store a reference identifier 117*a* in addition to bit vector 117-2, grain count 117-3, and/or header CRC data 117-4.

With reference to FIG. 1B, hash table module 111 includes the functionality to compute hash values and dynamically generate hash tables based on data associated with data streams received by system 100. Upon receipt of a data stream, the buffer management controller 112 can communicate signals to the hash table module 111 to process data stored in data input buffer 112-1 and/or reference block buffer 112-3 upon each buffer's receipt of the data. Hash table module 111 includes the functionality to compute hash values for subsets of data, such as bytes of data, associated with a data stream received by system 100 which can be stored within a generated hash table. For example, hash table module 111 can compute hash value for bytes of data associated with a data stream received by system 100. As such, hash table module 111 can be utilized by popular high performance compression schemes in a manner that accelerates the search for repeated data sequences. For example, hash table module 111 can be utilized by popular high performance compression schemes, including Snappy, Lempel-Ziv (LZ) compression schemes, Gzip or similar schemes.

Subsets of data may be of a pre-determined, fixed size and can be used to represent larger files for purposes of performing deduplication procedures. As such, hash table module 111 can compute a hash value for each byte of data received by system 100. In this manner, the hash table module 111 can compute hash values for subsets of data contemporaneous to their receipt and storage within a buffer generated by buffer management controller 112. Furthermore, hash computations may be performed in a manner consistent with how other components of system 100 compute hash values, such as fingerprint computation engine 110 or in a different manner.

According to one embodiment, hash table module 111 includes the functionality to dynamically generate reference hash tables based on reference data blocks identified by reference block identification module 130. Once selected by the reference block identification module 114, data blocks corresponding to reference blocks can be stored with within a reference block buffer, such as reference block buffer 112-3. As the reference blocks are being stored, the hash table module 111 can be configured to compute shingled hash values that correspond to the reference blocks. In this manner, the hash table module 111 can generate pre-computed hash tables that can accelerate the performance of compression and deduplication (procedures (performed by system 100.

For example, with reference to FIG. 1B, when a set of bytes are received by system 100 and stored within data input buffer 112-1 resident on system 100, the hash table module 111 can compute hash values for reference blocks determined and/or selected by reference block identification module 114 as corresponding to the set of bytes received. Hash table module 111 computes these hash values as reference data blocks are stored within reference data block buffer 112-3, which was dynamically generated by buffer management controller 112. In this fashion, buffer management controller 112 includes the functionality to create reference data block buffers that can parallel the functionality of data input buffers resident on system 100, such as data input buffer 112-1. As such, these computed reference block hash values can then be subsequently stored within reference hash table 111-1 generated by the hash table module 111.

Hash table module 111 includes the functionality to dynamically generate compression hash tables using a data stream received by system 100 and/or stored within data input buffers. Furthermore, hash table module 111 includes the functionality to modify and/or generate encoded data that can be used to subsequently decompress and/or reconstruct data streams previously processed by system 100. In this fashion, the hash table module 111 can be configured to modify and/or encode header data upon the identification of similar data sequences during compression operations. As such, the hash table module 111 can generate encoded data that includes reference identifiers that correspond to stored data previously identified by the hash table module 111.

For example, hash table module 111 can generate and/or modify encoded header data that includes the number of uncompressed data bytes identified by the hash table module 111, such as the number of identified literals, upon completion of hash computation procedures. In this fashion, the encoded data generated by hash table module 111 can provide instructions concerning how the decompression module can decompress or decode literal and/or copy elements that correspond to a set bytes associated with a data stream undergoing decompression procedures. Copy elements can include the bytes to be copied ("length") and/or how far back the data to be copied is ("offset").

For example, in one embodiment, header data generated and/or modified by the hash table module 111 can include a representation of identified literals and a corresponding literal data sequence. As such, decompression module 108 can read the encoded and/or modified header information which provides instructions concerning how the module can decompress the literal sequence. Furthermore, decompression module 108 can be configured to perform decompression procedures based on various compression schemes such as Snappy, LZ compression schemes, Gzip or similar schemes.

According to one embodiment, provided at least one reference block is selected and designated for storage within a reference block buffer, the hash table module 111 can send signals to components of system 100 to perform hash table lookup and/or header modification procedures using the reference hash table and/or the compression hash table for further processing based on computed hash values. In this fashion, hash table module 111 can create an interlock between reference hash table computations and the start of decompression procedures. Furthermore, hash computation procedures performed by the hash table module 111 for the compression hash table and reference hash table can be the same computer-implemented procedures or functions or different computer-implemented procedures or functions.

Table I provides an exemplary set of header formats or back-reference encoding format modifications capable of being modified by embodiments of the present invention.

TABLE I

| Compressed Header | Meaning |
| --- | --- |
| 00 | Literal, max length 60 bytes |
| 01 | Local Copy, 3 bit length, 11 bit offset |
| 10 | Local Copy, 6 bit length, 12 bit offset |
| 11 | Reference Copy, 12 bit length, 12 bit offset |

Scan and match engine 109 includes the functionality to perform hash table lookup procedures and perform hash value comparisons. Scan and match engine 109 includes the functionality to send and/or receive signals from the hash table module 111 to perform computer-implemented lookup procedures for comparing the computed hash values for subsets of data against reference data blocks currently stored by system 100.

The scan and match engine 109 can use hash table lookup logic to locate computed hash values within hash tables generated by the hash table module 111 and compare data. For example, hash table module ill can generate reference hash table 111-1 and compression hash table 111-2 and perform comparison operations. As such, the scan and match engine 109 can be configured to look up computed hash values for a subset of bytes against reference data blocks currently stored by system 100 within buffers generated by buffer management controller 112, such as reference block buffer 112-3.

In this fashion, the scan and match engine 109 can perform parallel or contemporaneous searches in both a reference hash table and a compression hash table created by the hash table module 111. When performing such lookup procedures, the scan and match engine 109 can also perform procedures for comparing a subsequent set of bytes received by system 100 against stored reference data block and/or compression hash values that correspond to data previously identified by the hash table module 111.

Figure 1D:
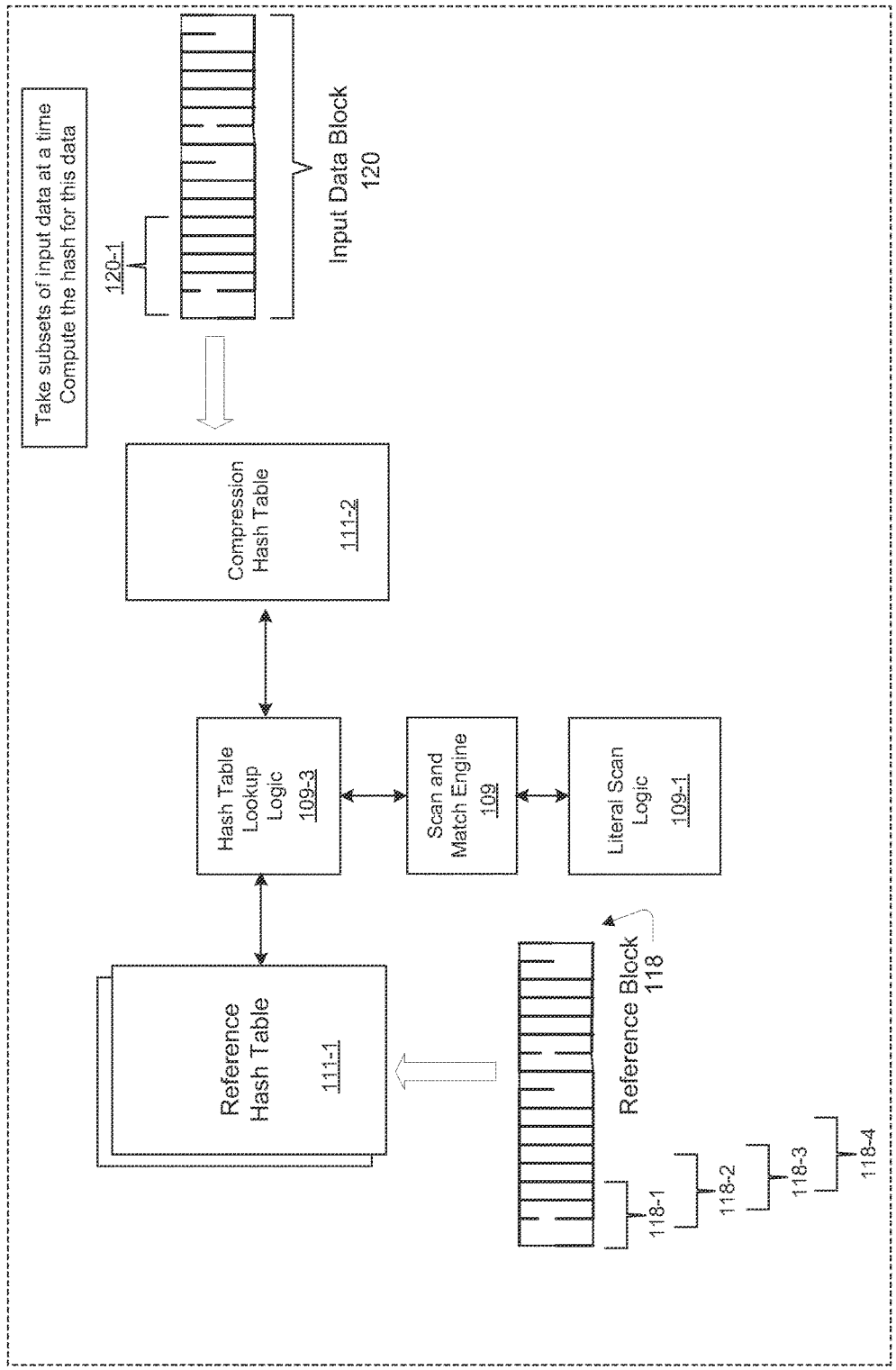
FIG. 1D depicts an exemplary combined reference hash table and compression hash table lookup scheme in accordance with embodiments of the present invention.

For instance, with reference to FIG. 1D, when reference block 118 is identified by the reference block identification module 114, hash table module 111 stores a computed hash value entry within reference hash table 111-1 that corresponds to portions of reference block 118 (e.g., values for reference block data subsets 118-1, 118-2, 118-3, 118-4, etc.) as it is stored in a reference block buffer. In this fashion, system 100 can use the fill time of the reference data buffer to compute and store the shingled hash function values of reference data corresponding to reference block 118, which enhances the performance of compression and deduplication procedures performed by system 100.

Moreover, as illustrated in FIG. 1D, as system 100 can also receive input data blocks 120 associated with an incoming data stream. As such, the scan and match engine 109 can use hash table logic 109-3 to perform parallel lookup procedures using populated reference hash table 111-1 and compression hash table 111-2 to identify previously stored sequences of data that are similar received data blocks 120. In this fashion, the scan and match engine 109 can perform comparisons using smaller subsets (e.g., input data block data subset 120-1) of data and reference blocks on a per-byte basis.

If the scan and match engine 109 detects a match between an entry within reference hash table 111 and/or compression hash table 111-2 and the computed hash value for data block 120, the scan and match engine 109 can then correspondingly send signals to decompression module 108 to decompress the subset of data within the reference block buffer or the data input buffer using modified compression header formats, such as the back-reference encoding format modifications described herein. Accordingly, decompressed output can then be stored within a buffer generated by the buffer management controller 112, such as the data output buffer 112-2.

In one embodiment, during the performance of decompression procedures, decompression module 108 can be configured to select one of a plurality of different sequences when the scan and match engine 109 detects a match either the reference hash table 111-1 and/or the compression hash table 111-2. For example, based on a pre-determined heuristic, the decompression module 108 can be configured to decompress data as literals, local copies, and/or reference copies. In this fashion, on decompression, system 100 can create a similar reference data input buffers such that a decompression implementation can be modified to interpret back-references from either an input data stream or from a reference block buffer.

As such, decompression module 108 can be configured to process literal scan logic 109-1 and/or local copy scan logic 109-2 used by the scan and match engine 109. It can be appreciated that embodiments of the present invention are not restricted to using a single reference block. Embodiments can be extended to encompass multiple reference blocks with simple modifications to the existing data paths and frame structures. For example, embodiments can be extended to multiple references block comparisons performed in parallel. Furthermore, hash table module 111 can be configured to generate multiple reference hash tables that correspond to a respective reference block of a set of different reference blocks. Moreover, multiple reference blocks can be stored within a single reference hash table generated by hash table module 111.

Furthermore, system 100 can be configured to detect early on and predict the compressibility of blocks prior to the performance of a data reduction operation, such as those described herein, in order to minimize wasted effort and to avoid a loss in overall system performance. For instance, the decompression module 108 includes the functionality to perform grouping procedures on data received by system 100. As such, decompression module 108 can include data grouping logic 108-1 which allows decompression module 108 to group incoming data, received via data input buffer 112-1, into subsets of data bytes or "shingles" that can be processed or operated on in a single instance. In this manner, hash table module 111 can compute hash values on overlapping data shingles selected by the decompression module 108 through data grouping logic 108-1. Moreover, hash values computed by hash table module 111 for overlapping shingles can be used as memory address locations which represent where shingle offset values are stored within data structures, such as compression hash table 111-2 and/or memory resident on system 100.

Additionally, scan and match engine 109 can use hash table module 111 to locate computed shingles and, in parallel, perform comparison operations on data blocks as they are written into data input buffer 112-1. For instance, using compression hash table 111-2, the scan and match engine 109 can detect the occurrence of a "hash hit" if it determines that a computed hash value for a shingle related to an incoming dataset shares the same signature as a hash value stored within compression hash table 111-2. In this fashion, scan and match engine 109 can detect the occurrence of a hash hit when two shingles have the same or similar signatures computed by signature computation engine 113.

Furthermore, scan and match engine 109 includes the functionality to send signals to decompression module 108 to increment a compressibility counter, such as hash hit counter 111-3. In this fashion, hash hit counter 111-3 can be incremented each time scan and match engine 109 detects the occurrence of a hash hit. Hash hit counter 111-3 allows system 100 to keep track of hash values that frequently appear within an incoming dataset received by system 100. Accordingly, at end of a data transfer into data input buffer 112-1, system 100 can store a set of computed hashes for an entire dataset.

Additionally, system 100 can be configured to store frequent hash value match thresholds which enable it to better determine which data blocks would benefit the most from having data reduction procedures performed on it (e.g., data deduplication procedures, reference block identification procedures, data compression procedures, etc.). In this fashion, system 100 can be configured in a manner that allows it to automatically interpret compressibility characteristics using pre-determined threshold values and/or computed compressibility counts. For instance, prior to the performance of any data reduction procedures by system 100, it can first refer to the pre-determined threshold count and decide whether to perform, halt and/or suspend a data reduction operation.

In this manner, components of system 100, such as decompression module 108, can generate an instruction or set of instructions that instruct components of system 100 to initialize performance of a data reduction operation (e.g., data deduplication procedures, reference block identification procedures, data compression procedures, etc.) when the threshold count meets or exceeds a frequent hash value match threshold. Accordingly, components of system 100 can generate an instruction or set of instructions that instruct components of system 100 to refrain from performing a data reduction operation when the threshold count fails to meet a frequent hash value match threshold. Such determinations by system 100 not only can save on host CPU cycles, but it can also allow data to move through the system without interrupting other drivers, such as host drivers.

For example, in one embodiment, if the value of hash hit counter 111-3 is below a pre-determined threshold value, decompression module 108 may determine that data blocks under current analysis exhibit low compressibility characteristics, thereby demonstrating a high entropy level for at least a portion of the data stream. Accordingly, in response to this determination, decompression module 108 can be configured to not perform any decompression operations. In this fashion, decompression module 108 can be configured to send instructions that halt and/or suspend the performance of decompression operations.

However, if the value of hash hit counter 111-3 is equal to or above the pre-determined threshold value, decompression module 108 may determine that data blocks exhibit high compressibility characteristics, thereby demonstrating a low entropy level for at least a portion of the data stream. Accordingly, in response to this determination, decompression module 108 can be configured to send instructions that initialize the performance of a decompression operation. In this fashion, decompression module 108 uses compressibility factors to determine whether to issue "compress" or "bypass compress" signals to other components of system 100 for a given set of bytes related to an incoming dataset stored within data input buffer 112-1.

In this manner, system 100 can measure entropy related to datasets stored within data input buffer 112-1 based on the frequency of detected similarities between data blocks of a given dataset. According to one embodiment, scan and match engine 109 can calculate the frequency of hash hits using histogram representations of the data. Additionally, hash hit counter 111-3 can be implemented through hardware or software.

Furthermore, system 100 can also be configured to dynamically adjust threshold values based on system load and or user preferences. In this fashion, the threshold for compression can be relaxed for purposes of increasing the compression ratio at the expense of power and latency. Similarly, to achieve lower average latencies, higher threshold values can be used.

Figure 2A:
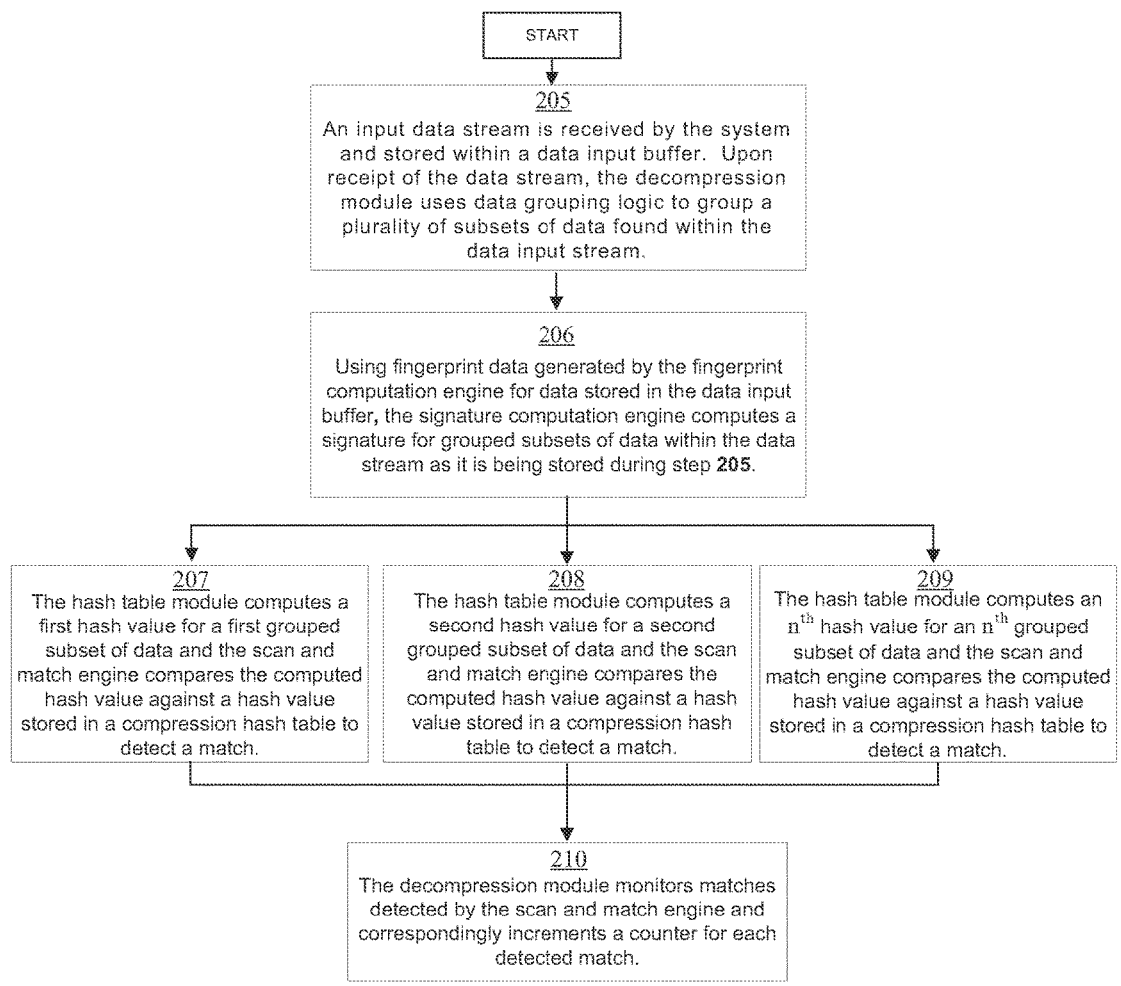
FIG. 2A is a flowchart of a first portion of an exemplary process for single pass entropy detection in accordance with embodiments of the present invention.

FIG. 2A is a flowchart of a first portion of an exemplary process for single pass entropy detection in accordance with embodiments of the present invention.

At step 205, an input data stream is received by the system and stored within a data input buffer. Upon receipt of the data stream, the decompression module uses data grouping logic to group a plurality of subsets of data found within the data input stream. The size of the subsets can be pre-determined and of a fixed size.

At step 206, using fingerprint data generated by the fingerprint computation engine for data stored in the data input buffer, the signature computation engine computes a first signature for a first grouped subset of data within the data stream as it is being stored during step 205.

At step 207, the hash table module computes a first hash value for the first grouped subset of data and compares the computed hash value against a hash value stored in a hash table to detect a match.

At step 208, the hash table module computes a second hash value for a second grouped subset of data and compares the computed hash value against a hash value stored in a hash table to detect a match.

At step 209, the hash table module computes a an $n^{th}$ hash value for an $n^{th}$ grouped subset of data and compares the computed hash value against a hash value stored in a hash table to detect a match.

At step 210, the decompression module monitors matches detected by the hash table module and correspondingly increments a counter for each detected match.

Figure 2B:
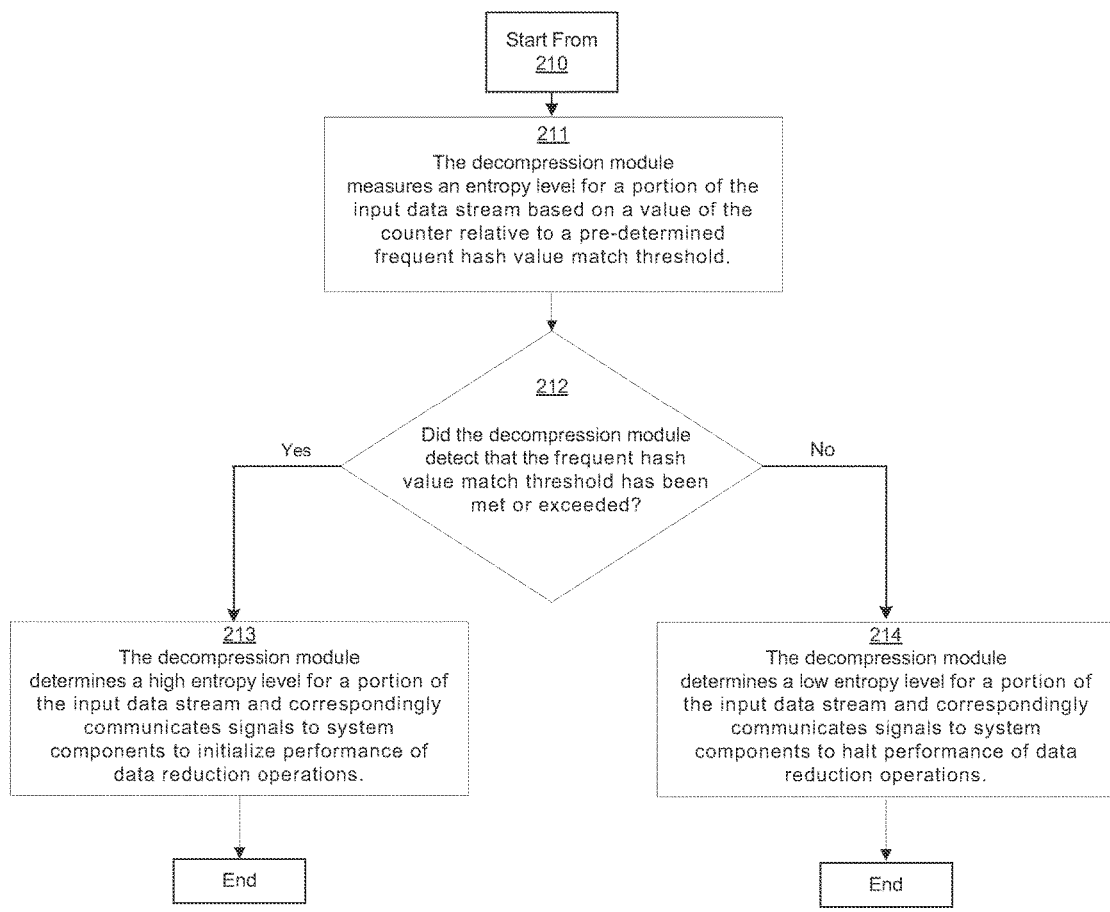
FIG. 2B is flowchart of a second portion of an exemplary process for single pass entropy detection in accordance with embodiments of the present invention.

FIG. 2B is flowchart of a second portion of an exemplary process for single pass entropy detection in accordance with embodiments of the present invention. The details of operation 210 (see FIG. 2A) are outlined in FIG. 2B.

At step 211, the decompression module determines an entropy level for a portion of the input data stream based on a value of the counter relative to a pre-determined frequent hash value match threshold.

At step 212, a determination is made by the decompression module as to whether it detects that the frequent hash value match threshold has been met or exceeded. If the decompression module detects that the frequent hash value match threshold has been met or exceeded, the decompression module determines a high entropy level for a portion of the input data stream and correspondingly communicates signals to system components to initialize performance of data reduction operations, as detailed in step 213. If the decompression module detects that the frequent hash value match threshold has not been met, the decompression module determines a low entropy level for a portion of the input data stream and correspondingly communicates signals to system components to halt performance of data reduction operations, as detailed in step 214.

At step 213, the decompression module detects that the frequent hash value match threshold has been met or exceeded and, therefore, the decompression module determines a high entropy level for a portion of the input data stream and correspondingly communicates signals to system components to initialize performance of data reduction operations.

At step 214, the decompression module detects that the frequent hash value match threshold has not been met and, therefore, the decompression module determines a low entropy level for a portion of the input data stream and correspondingly communicates signals to system components to halt performance of data reduction operations.

Figure 3A:
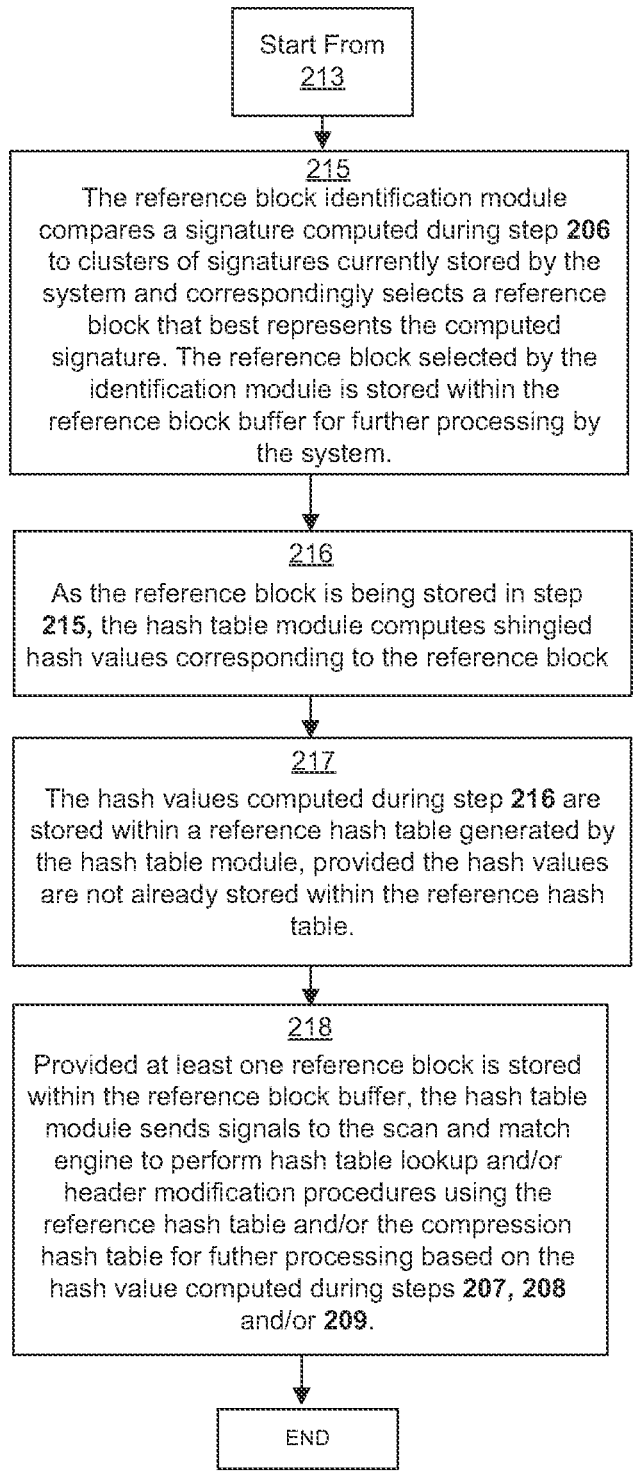
FIG. 3A is a flowchart of an exemplary process for contemporaneous data deduplication and compression in accordance with embodiments of the present invention.

FIG. 3A is a flowchart of an exemplary process for contemporaneous data deduplication and compression in accordance with embodiments of the present invention. The details of operation 213 (see FIG. 2B) are outlined in FIG. 3A.

At step 215, the reference block identification module compares a signature computed during step 206 to clusters of signatures currently stored by the system and correspondingly selects a reference block that best represents the computed signature. The reference block selected by the reference block identification module is stored within the reference block buffer for further processing by the system.

At step 216, as the reference block is being stored in step 215, the hash table module computes shingled hash values corresponding to the reference block.

At step 217, the hash values computed during step 216 are stored within a reference hash table generated by the hash table module, provided the hash values are not already stored within the reference hash table.

At step 218, provided at least one reference block is stored within the reference block buffer, the hash table module sends signals to the scan and match engine to perform hash table lookup and/or header modification procedures using the reference hash table and/or the compression hash table for further processing based on the hash value computed during steps 207, 208, and/or 209.

Figure 3B:
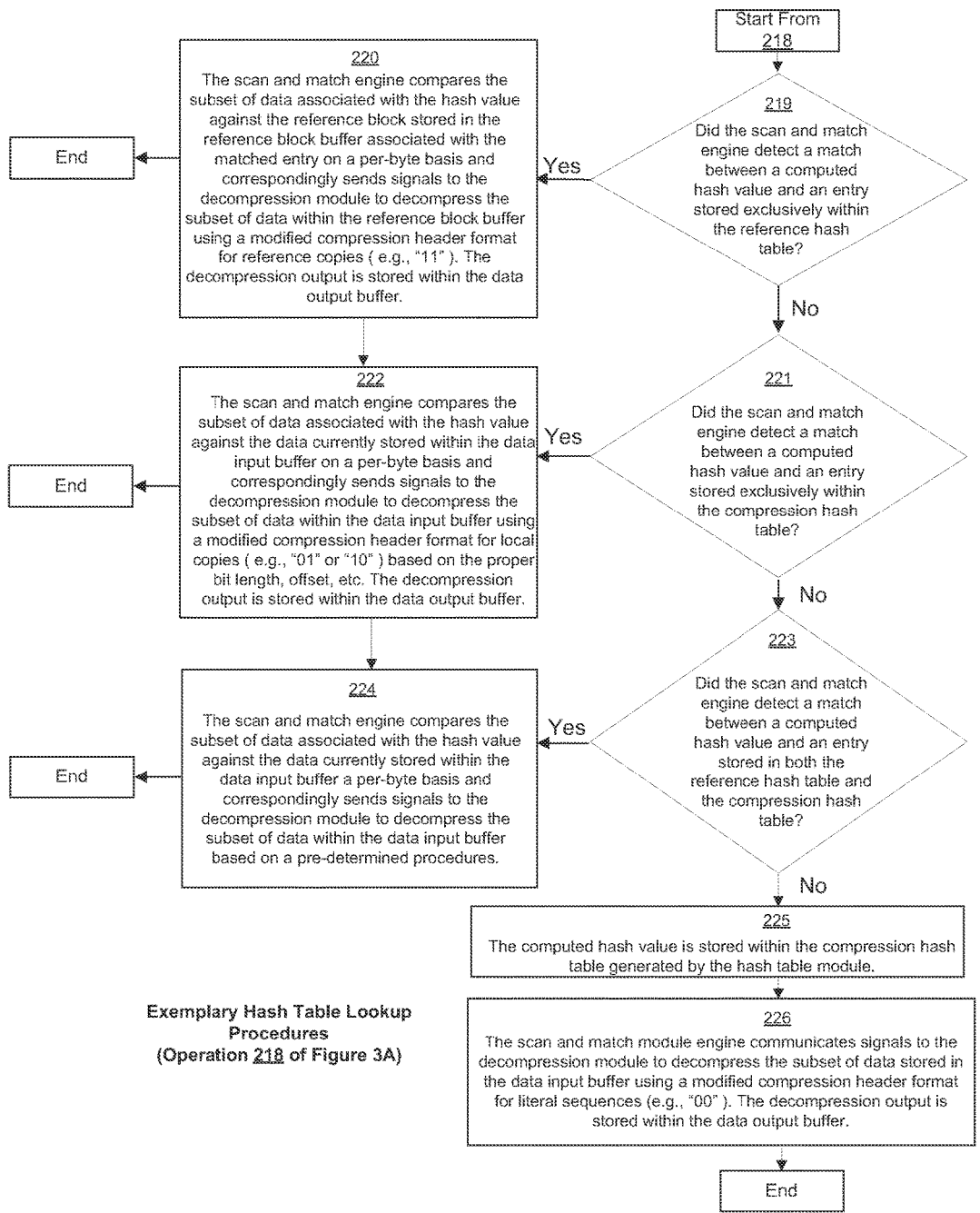
FIG. 3B is a flowchart of an exemplary process for performing hash table lookup procedures in accordance with embodiments of the present invention.

FIG. 3B is a flowchart of an exemplary process for performing hash table lookup procedures in accordance with embodiments of the present invention. The details of operation 218 (see FIG. 3A) are outlined in FIG. 3B.

At step 219, a determination is made by the scan and match engine as to whether it detected a match between a computed hash value and an entry stored exclusively within the reference hash table. If the scan and match engine determines that a match was detected, then the scan and match engine compares the subset of data associated with the hash value against the reference block stored in the reference block buffer associated with the matched entry on a per-byte basis, as detailed in step 220. If the scan and match engine determines that no match was detected, then a determination is made by the scan and match engine as to whether it detected a match between a computed hash value and an entry stored exclusively within the compression hash table, as detailed in step 221.

At step 220, the scan and match engine determined that a match was detected and therefore, the scan and match engine compares the subset of data associated with the hash value against the reference block stored in the reference block buffer associated with the matched entry on a per-byte basis and correspondingly sends signals to the decompression module to decompress the subset of data within the reference block buffer using a modified compression header format for reference copies, such as "11". The decompressed output is stored within the data output buffer.

At step 221, the scan and match engine determined that no match was detected and, therefore, a determination is made by the scan and match engine as to whether it detected a match between a computed hash value and an entry stored exclusively within the compression hash table. If the scan and match engine determines that a match was detected, then the scan and match engine compares the subset of data associated with the hash value against the data currently stored within the data input buffer on a per-byte basis, as detailed in step 222. If the scan and match engine determines that no match was detected, then a determination is made by the scan and match engine as to whether it detected a match between a computed hash value and an entry stored within both the reference hash table and compression hash table, as detailed in step 223.

At step 222, the scan and match engine determined that a match was detected and therefore, the scan and match engine compares the subset of data associated with the hash value against the data currently stored within the data input buffer on a per-byte basis and correspondingly sends signals to the decompression module to decompress the subset of data within the data input buffer using a modified compression header format for local copies, such as "01" or "10", based on the proper bit length and offset. The decompressed output is stored within the data output buffer.

At step 223, the scan and match engine determined that no match was detected and, therefore, a determination is made by the scan and match engine as to whether it detected a match between a computed hash value and an entry stored within both the reference hash table and compression hash table. If the scan and match engine determines that a match was detected, then scan and match engine compares the subset of data associated with the hash value against the data currently stored within the data input buffer on a per-byte basis and correspondingly sends signals to the decompression module to decompress the subset of data within the data input buffer based on pre-determined procedures.

At step 224, the scan and match engine determined that a match was detected and therefore, the scan and match engine compares the subset of data associated with the hash value against the data currently stored within the data input buffer on a per-byte basis and correspondingly sends signals to the decompression module to decompress the subset of data within the data input buffer based on a pre-determined procedures. According to one embodiment, pre-determined procedures can include configuring the scan and match engine to bias its selection of decompression procedures towards local matches or reference matches depending on the length of the copy and/or some other knowledge of the data associated with the data stream.

At step 225, the scan and match engine determined that no match was detected and, therefore, the computed hash value is stored within the compression hash table generated by the hash table module.

At step 226, the scan and match engine communicates signals to the decompression module to decompress the subset of data stored in the data input buffer using a modified compression header format for literal sequences, such as "00". The decompressed output is stored within the data output buffer.

Although certain preferred embodiments and methods have been disclosed herein, it will be apparent from the foregoing disclosure to those skilled in the art that variations and modifications of such embodiments and methods may be made without departing from the spirit and scope of the invention.

According to an embodiment, the techniques described herein can be implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be database servers, storage devices, desktop computer systems, portable computer systems, handheld devices, networking devices or any other device that incorporates hard-wired and/or program logic to implement the techniques.

In the foregoing detailed description of embodiments of the present invention, numerous specific details have been set forth in order to provide a thorough understanding of the present invention. However, it will be recognized by one of ordinary skill in the art that the present invention is able to be practiced without these specific details. In other instances, well-known methods, procedures, components, and circuits have not been described in detail so as not to unnecessarily obscure aspects of the embodiments of the present invention. Although a method is able to be depicted as a sequence of numbered steps for clarity, the numbering does not necessarily dictate the order of the steps. It should be understood that some of the steps may be skipped, performed in parallel, or performed without the requirement of maintaining a strict order of sequence. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part.

What is claimed is:

1. An apparatus comprising:
    a memory unit for storing data streams; and
    a processor coupled to said memory unit, the processor configured to perform a compression operation and a deduplication operation in a single pass, said processor configured to:
    use a subset of data from a data stream to generate a reference data block corresponding to said subset of data;
    compute a first hash value for said subset of data and a second hash value for said reference block using a same function;
    compare the first hash value computed for said subset of data to the second hash value computed for said reference data block, wherein said first hash value and said second hash value are stored in separate hash tables;
    generate a compressed and deduplicated representation of said subset of data by at least modifying header data corresponding to said subset of data responsive to a detected match between said first hash value and said second hash value,
    wherein said compressed representation is generated using said reference data block responsive to the detection of the match between said first hash value and said second hash value,
    wherein said separate hash tables comprises a reference hash table and said second hash value is stored in said reference hash table; and
    initiate decompression procedures upon storing said reference data block in a memory buffer and upon generation of said compressed representation.

2. The apparatus of claim 1, wherein said separate hash tables comprises a compression hash table.

3. The apparatus of claim 1, wherein said processor is operable to generate an interlock by the initiation of the decompression procedures upon storing said reference data block in said memory buffer.

4. The apparatus of claim 1, wherein said processor is operable to modify said header data using a back-reference encoding format based on a heuristic.

5. A computer-implemented method of performing data reduction operations on an input data stream during a single pass, said method comprising:
    receiving a subset of data from a data stream;
    selecting a reference data block corresponding to said subset of data, wherein said reference data block is stored in a memory buffer;
    comparing a first hash value computed for said subset of data to a second hash value computed for said reference data block, wherein said first hash value and said second hash value are stored in separate hash tables, wherein said first hash value and said second hash value are computed using a same function;
    generating a compressed representation of said subset of data by at least modifying header data corresponding to said subset of data responsive to a detected match between said first hash value and said second hash value,
    wherein said compressed representation is generated using said reference data block responsive to the detected match between said first hash value and said second hash value, wherein said separate hash tables comprises a reference hash table and said second hash value is stored in said reference table; and
    initiating decompression procedures upon storing said reference data block in said memory buffer and upon generation of said compressed representation.

6. The computer-implemented method of claim 5, wherein said separate hash tables comprises a compression hash table.

7. The computer-implemented method of claim 5, further comprising: generating an interlock by the initiation of the decompression procedures upon storing said reference data block in said memory buffer.

8. The computer-implemented method of claim 5, wherein said modifying further comprises modifying said header data using a back-reference encoding format based on a heuristic.

* * * * *